(12) United States Patent
Kuznicki et al.

(10) Patent No.: US 9,711,674 B2
(45) Date of Patent: Jul. 18, 2017

(54) METHODS FOR PRODUCING PHOTOVOLAIC MATERIAL AND DEVICE ABLE TO EXPLOIT HIGH ENERGY PHOTONS

(75) Inventors: Zbigniew T. Kuznicki, Hoenheim (FR); Patrick Meyrueis, Strasbourg (FR)

(73) Assignee: Volumion S.A.S (FR)

( * ) Notice: Subject to any disclaimer, the term of this patent is extended or adjusted under 35 U.S.C. 154(b) by 1070 days.

(21) Appl. No.: 12/998,102

(22) PCT Filed: Feb. 6, 2009

(86) PCT No.: PCT/IB2009/005023
§ 371 (c)(1),
(2), (4) Date: Mar. 17, 2011

(87) PCT Pub. No.: WO2010/089624
PCT Pub. Date: Aug. 12, 2010

(65) Prior Publication Data
US 2011/0162700 A1    Jul. 7, 2011

(51) Int. Cl.
*H01L 31/06* (2012.01)
*H01L 31/068* (2012.01)
*H01L 31/072* (2012.01)
*H01L 31/18* (2006.01)

(52) U.S. Cl.
CPC .......... *H01L 31/068* (2013.01); *H01L 31/072* (2013.01); *H01L 31/1804* (2013.01);
(Continued)

(58) Field of Classification Search
CPC . H01L 31/068; H01L 31/072; H01L 31/1804; H01L 31/1864; H01L 31/1872;
(Continued)

(56) References Cited

U.S. PATENT DOCUMENTS 5,935,435 A * 8/1999 Hasler .......................... 210/232
2001/0030331 A1  10/2001 Minato

OTHER PUBLICATIONS

CBE2124, Levicky.*
(Continued)

*Primary Examiner* — Bethany L Martin
(74) *Attorney, Agent, or Firm* — St. Onge Steward Johnston & Reens, LLC

(57) ABSTRACT

The present invention concerns methods for producing photovoltaic material and a device able to exploit high energy photons. The photovoltaic material is obtained from a conventional photovoltaic material having a top surface intended to be exposed to photonic radiation, having a built-in P-N junction delimiting an emitter part and a base part and comprising at least one area or region specifically designed, treated or adapted to absorb high energy or energetic photons, located adjacent or near at least one hetero-interface. According to the invention, this material is subjected to treatments resulting in the formation of at least one semiconductor based metamaterial field or region being created, as a transitional region of the or a hetero-interface, in an area located continuous or proximate to the or an absorption area or region for the energetic photons of the photonic radiation impacting said photovoltaic material.

18 Claims, 9 Drawing Sheets

Figure 1:
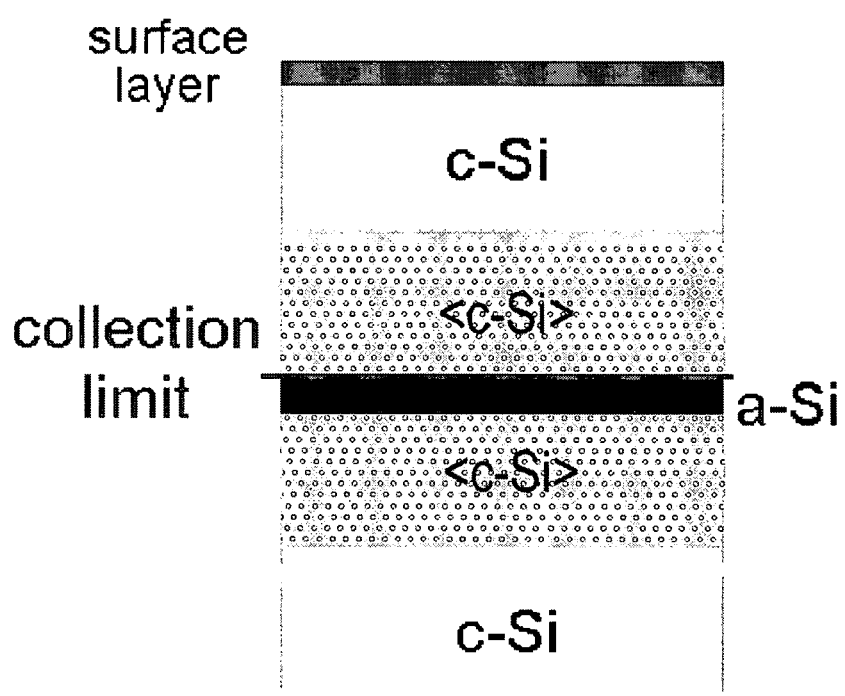

(52) U.S. Cl.
CPC ...... *H01L 31/1864* (2013.01); *H01L 31/1872* (2013.01); *Y02E 10/547* (2013.01); *Y02P 70/521* (2015.11)

(58) Field of Classification Search
CPC ......... H01L 31/0352; H01L 31/035245; H01L 31/035254; H01L 31/036; H01L 31/0376
See application file for complete search history.

(56) References Cited

OTHER PUBLICATIONS

Cambridge Dictionaries Online.*
Lucovsky, G. Philips J. A self-consistent model for defect states in a-Si and a-Si:H. J Mater Sci: Mater Electron 2007, vol. 18, p. S463-S467.*
Li et al. 35% efficient nonconcentrating novel silicon solar cell. Appl. Phys. Lett. 1992, vol. 60, issue 18, p. 2240-2242.*
Shalav et al. Application of NaYF4:Er3+ up-converting phosphors for enhanced near-infrared silicon solar cell response. Applied Physics Letters 2005, vol. 86, p. 013505.*
Kuo et al. Realization of a near-perfect antireflection coating for silicon solar energy utilization. Optics Letters 2008, vol. 33, p. 2527-2529).*
Low Energy Generation ILN a Silicon Metmaterial—Sep. 1, 2008.
Multistage PV Conversion on a Nanostructured Silicon Metamaterial—Sep. 1, 2008.
Electronic Transport in Mind Model Solar Cells—May 19, 2002.
Semiconductor Devices Physics and Technology—Dec. 31, 1985.
Divancy Profiles in MeV Helium Irradiated Silicon—Dec. 1, 1999.
Identification of Open-Volume Defects in Disordered and Amorphized Si—Jun. 1, 2001.

* cited by examiner

METHODS FOR PRODUCING PHOTOVOLAIC MATERIAL AND DEVICE ABLE TO EXPLOIT HIGH ENERGY PHOTONS

The present invention relates to the field of the conversion of photonic energy, in particular radiated solar energy into electrical energy. It aims more specifically the increase in output and conversion efficiencies of photovoltaic materials, and thus in photovoltaic devices (photocells, solar cells, optoelectronic converters, . . . ).

The present invention concerns more specifically a method for producing a photovoltaic material, a method for producing a photovoltaic device and a photovoltaic device, able to exploit high energy photons.

At present, solar cells fabricated on an industrial scale have an output which is to say a maximum power ratio of peak/incident photovoltaic flux, of the order of 15 to 18%.

These cells, widely commercialised, are constituted of a monocrystalline silicon material and generally have a [emitter/base/rear field] structure with a single P-N junction.

Moreover, the surface exposed to the photonic radiation is normally subjected to a passivation operation and is coated with an anti-reflective surface.

In order to increase the efficiency, it has been proposed to produce photocells based on monocrystalline silicon partially modified so as to attempt to enlarge the natural absorption spectrum of the starting material, particularly in the infrared range, and thereby to increase the output of the resultant photocell.

More particularly, the proposals set forth consist, by an implantation of hydrogen and a consecutive thermal treatment, in transforming to the local level the crystalline structure of the silicon to create a buried layer provided with extrinsic levels.

These different experimental approaches are particularly described in the following articles: "35% Efficient Nonconcentrating Novel Silicon Solar Cell", J. Li et al., Appl. Phys. Lett., 60 (1992) 2240-2242; "A study on Solar Cells based on the "Junction Near Local Defect Layer Design", C. Sumnote et al., 11$^{th}$ E.C. Photovoltaic Solar Energy Conference, Montreux, Switzerland, October 1992, pages 370 to 373 and "New Type of Silicon Material with High Quality Surface Layer on Insulating Defect Layer", Electronic Letters, 28 (1992) 652-653.

Furthermore, U.S. Pat. No. 5,935,345 discloses a process for the production of such a photovoltaic material with increased absorption efficiency in IR, comprising an amorphised substructure buried near the front or top face.

WO-A-01/039281 discloses an evolution of the previous process, aiming to preserve as much as possible the beneficial defects and to limit the dispersion of the performances of the resulting photovoltaic material and devices.

Nevertheless, these known methods could not lead to a production process which provided photovoltaic materials with constant or foreseeable features and guaranteed very high conversion performances, as the involved mechanisms, and also the requested beneficial means and conditions, were not completely understood until now and as no topical technological control method able to evaluate the characteristics and conversion quality of the modified semiconductor substructure has been available.

In particular, two major limitative phenomena were not taken into account, namely: light induced opacity (see Z. T. Kuznicki et al, "Solar light-induced opacity of Mind cells", 1-4244-0016-3/06, IEEE, 2006) and electronic transport in dense electron gas or amorphised semiconductor material.

It is a main aim of the present invention to overcome the aforementioned limitations and drawbacks.

Therefore, the present invention first concerns a method for producing a photovoltaic material able to absorb and exploit high energy or energetic photons, in particular UV and visible photons, characterised in that said method consists in:

a) providing or producing a conventional p-type or n-type photovoltaic material made of inorganic crystalline semiconductor material(s), such as Si or GaS, having a top surface intended to be exposed to photonic radiation, having a built-in P-N junction delimiting an emitter part and a base part and comprising at least one area or region specifically designed, treated or adapted to absorb high energy or energetic photons, located adjacent or near at least one hetero-interface;

b) generating or maintaining structural defects within an n-type area of said emitter and/or base part of the material consisting of divacancies able to function as low-energy secondary generation centers grouped together in (a) nanometric formation(s) and persistent under production process and photovoltaic conversion conditions;

c) introducing, in particular diffusing or implanting, n-type doping impurities, such as phosphorus or arsenic, according to determined intensity, energy and profile in order to put the divacancies into an electrical charge state in which they are saturated with weakly bonded electrons and to provide an excellent conduction within said or each region of implanted impurities, such as metallic type conduction in heavily doped semiconductor material;

whereas steps b) and c) are performed in such a way that they result into at least one semiconductor based metamaterial field or region being created, as a transitional region of the or a hetero-interface, in an area located continuous or proximate to the or an absorption area or region for the energetic photons of the photonic radiation impacting said photovoltaic material, at least within the range of thermalisation of the primary electrons liberated directly by said energetic photons and which collide with metamaterial low-energy generation centers liberating secondary generation electrons in a multistage processing, the order of which depends on remaining energy kept by the primary electrons at the moment of their generation collision;

d) providing a built-in electric field or means to apply an electric field which encompasses or extends over said or each metamaterial field or region and shows an intensity sufficient to withdraw and move away said liberated secondary electrons from their initial sites within the concerned metamaterial area or region, at a speed sufficient to prevent their return into said metamaterial region or field, wherein steps b) and c) are further performed in such a way that, on the one hand, the density of divacancies within the metamaterial field(s) or region(s) is greater than $10^{18}$ divacancies/cm$^3$, preferably greater than $10^{19}$ divacancies/cm$^3$, most preferably greater than $10^{20}$ divacancies/cm$^3$ and, on the other hand, the conduction between the metamaterial and the respectively adjacent N-type material has a time constant which is at the most of the same magnitude than the secondary carrier generation time constant.

The P-N junction can define, depending on its position in the semiconductor material, either a thin emitter (p-type semiconductor material) or a thick emitter (n-type semiconductor material).

In the present specification, "metamaterial" means an artificial material showing physical properties which are going beyond, complementary or significantly greater in comparison with the corresponding properties of the corresponding natural material, despite the preservation of its original chemical composition. More specifically, the metamaterial addressed here can be a continuous or discontinuous layer, but also a field of pearl like agglomerates, and shows in particular a very high optical absorption, a low-energy secondary generation/conversion, a multiplication of the low-energy electrons and of the free carriers, a specific electronic transport, an increased sensitivity to excitation intensity and a strong optical non linearity.

According to a first process alternative, the invention proposes to generate divacancies in the vicinity of the or a hetero-interface between two phases of the semiconductor material or two types of semiconductor materials by means of an energy beam, for example an electron beam.

According to a second process alternative, it can be proposed to amorphise at least one area or region of the semiconductor material in order to create a corresponding absorption area or region for the energetic photons, and then preserving the structural defects generated during amorphisation during the following production steps.

The invention production method also comprises, preferably after step c), at least one thermal treatment step of the photovoltaic material of determined duration and intensity, with a total energy balance of said thermal treatment(s) depending at least on the depth and the thickness of the buried metamaterial field(s) or region(s), on the doping level(s), ionisation grade(s) and energy(ies) of said implanted or diffused impurities, on the doping profile(s), on the desired density of the structural defects and on the sought-after optoelectronic activity of the active defects.

Advantageously, the thermal treatment consists in one initial continuous annealing step, followed by at least one cycle of successive discontinuous annealing sequences.

U.S. Pat. No. 5,935,345 and WO-A-01/039281 describe possible examples of amorphising, doping and thermal treatment operations, and the teaching and content of these two documents are incorporated herein by reference.

It should be noticed that steps a) to d) of the production process, as well as the thermal treatment step, can be performed either in the order indicated before or in a different order.

In particular, a mixing or entangling of steps b) to d) of the thermal treatment, at least partly, with the various operations performed in step a) can be contemplated.

In order to ensure a constant quality of the produced material, it is envisaged to perform in situ at least one non destructive characterisation and control step of the photovoltaic material during and/or at the end of its production process, preferably on randomly chosen samples.

Preferably, several characterisation and control steps are performed during the production process of the photovoltaic material by way of reflection or absorption measurements at different wavelengths and of comparison with standard or reference samples, using stored precollected reference data.

Alternatively, said characterisation and control steps can also be done by way of electric parameter, preferably capacity, measurements at different wavelengths and of comparison with standard or reference samples, using stored precollected reference data.

Figure 11:
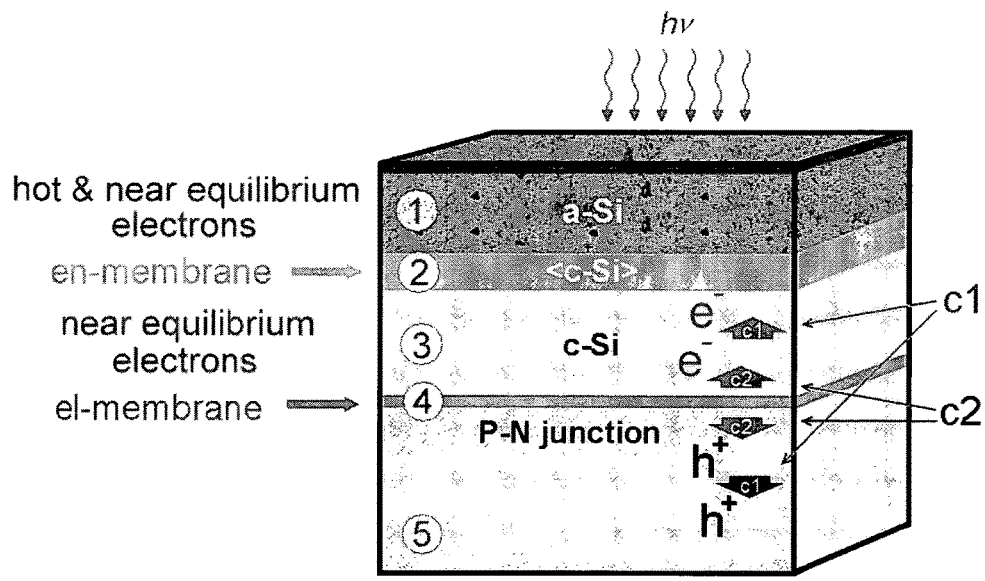

As shown in FIGS. 1 and 11, the production process can consist in forming one continuous or discontinuous semiconductor metamaterial layer or field intimately associated with a continuous or discontinuous area or region of amorphised semiconductor material, located at or near the top surface of the semiconductor material, both field and region together forming a front substructure.

Figure 4:
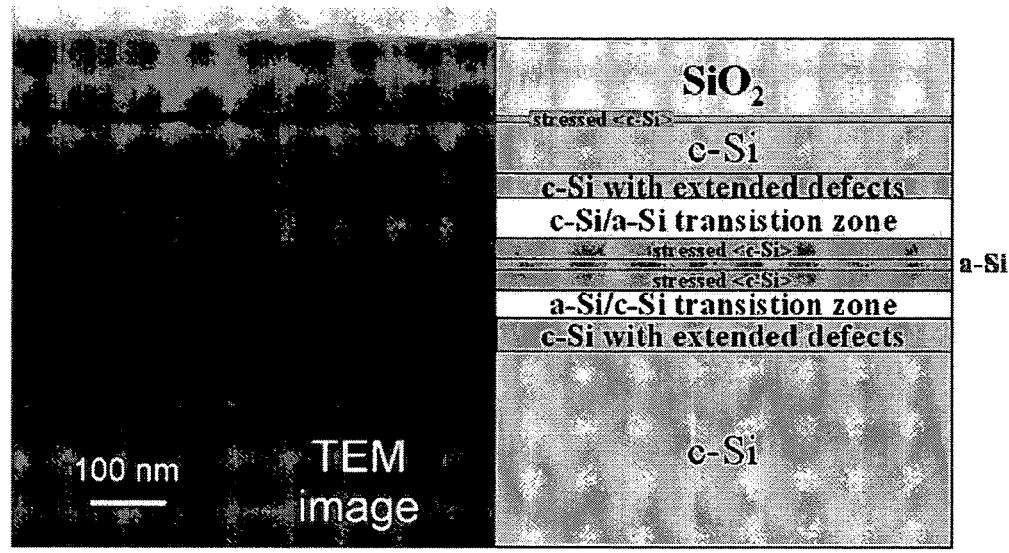
Figure 13:
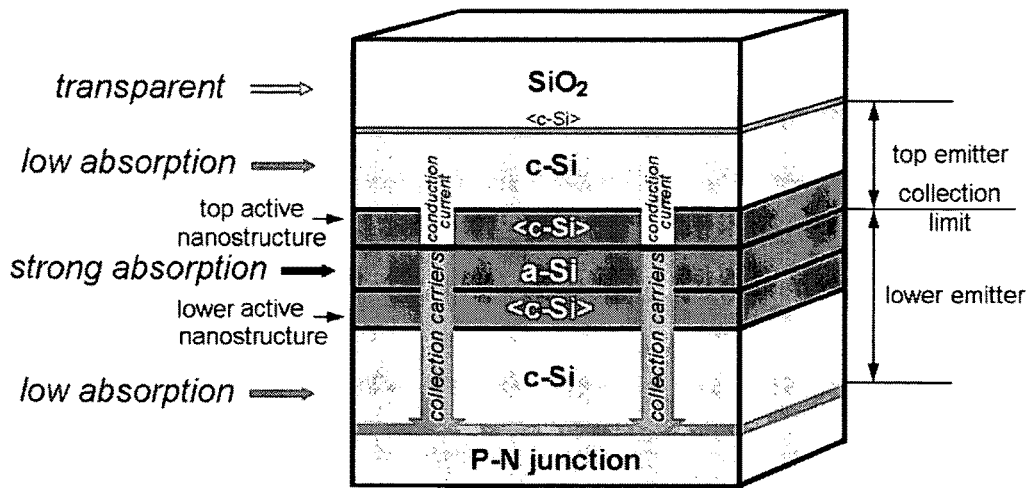
Figure 14:
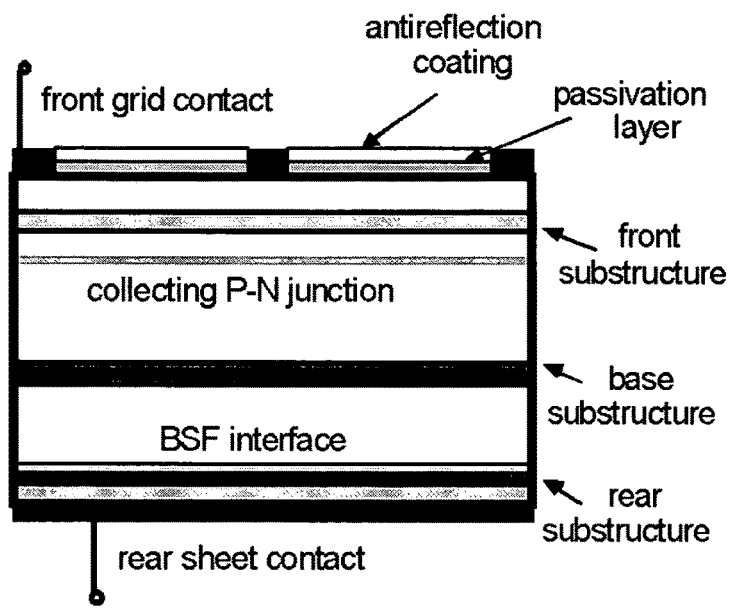

As shown in FIGS. 4, 13 and 14, it can also be contemplated to form, simultaneously or in successive production cycles, at least two continuous or discontinuous semiconductor metamaterial nanoscale layers or fields, at least one of which being buried within the thickness of said material in the emitter or base part and intimately associated with a respective continuous or discontinuous area or region of amorphised semiconductor material, comprising the same type of doping impurities and forming, with the respectively associated metamaterial layer or field, a substructure.

Advantageously, the setting of the parameters of the successive operational production steps are such that the thickness of the or each planar amorphous semiconductor material layer is comprised between 10 nm and 50 nm and that the width of the respectively associated metamaterial field(s) or region(s), in the shape (a) continuous or discontinuous layer(s), having a thickness less than 15 nm, preferably less than 10 nm, the semiconductor material having preferably a thickness comprised within 5 µm and 500 µm, preferably between 10 µm and 280 µm.

It should be noticed that light transmission can be improved by reducing the thickness of the superficial amorphisation (the limit being the preservation of the useful mechanical constraint).

It can also be improved by keeping the amorphising implantation energies low (the <c-Si> formation being formed nearer to the front surface) or by partly stripping away the amorphised layer by means of reactive ion etching (RIE) process. This last process increases also the superficial recombination speed by forming a damaged superficial nanolayer.

According to an advantageous embodiment of the invention, the production method can consist in performing a local amorphisation step, followed by suitable doping and annealing steps, through an adapted implantation mask so that the or each amorphous layer and the associated metamaterial layer(s) form together a substructure extending parallel to the top surface of the photovoltaic material or a substructure extending inclined, preferably perpendicular, to the top surface of the photovoltaic material.

By way of example, the total energy balance of the thermal treatment for one continuous nanoscale planar metamaterial layer buried within the emitter part of the photovoltaic material is approximately equivalent to that of a continuous thermal annealing of a duration of about 30 to 50 minutes, preferably of about 40 minutes, at a temperature comprised between 450° C. and 600° C., preferably of about 500° C.

The thermal treatment can be performed as described in the previously quoted US and WO documents, or can consist in laser annealing or rapid thermal annealing/rapid thermal processing (RTA/RTP annealing) combined with epitaxial layer deposition to adapt the geometry in terms of disposition, distances, thermalisation restraints and time constant optimisation.

In order to facilitate free carrier extraction, forming locally implanted amorphised conductive material projections in the shape of columns or bars, extending from the substructure(s) towards the top surface can be envisaged.

The present invention also concerns a method for producing a photovoltaic device able to exploit high energy photons, in particular UV and visible photons, preferably in addition to IR photons, characterised in that it consists in:

providing a slab, wafer or chip of the photovoltaic material produced according to the method described before, with at least one active substructure comprising at least one absorption area or region for the energetic photons and at least one nanoscale field or region of metamaterial, forming front and rear conductive structures on said slab, wafer or chip able to extract the carriers generated within the photovoltaic material, subjecting the front and/or rear surface of said slab, wafer or chip to (an) additional treatment(s) in order to alter their reflection and/or conversion properties.

Advantageously, grooved contact strips penetrating down into the at least one substructure can be formed.

To increase the conversion efficiency of the device in a complementary manner, it can be considered to form on the rear face of the slab, wafer or chip, a featured layer able to perform plasmonic absorption of the IR radiations and an up-conversion into preferentially green or blue, for example by providing a buried $E_r^{3+}$ ion layer close to said rear face.

A possible way to produce the means necessary for this up-conversion mechanism is described in "Enhanced upconversion by plasmonic field concentration", L. Kuipers, A. Polman, MRS Fall Meeting 2008, Dec. 1-15, Boston, U.S.A.

So as to realise an optimal conversion of the up-converted, the production process is advantageously performed so that the photovoltaic material of the slab, wafer or chip comprises an active substructure incorporating an absorption area or region for the energetic photons and at least one nanoscale metamaterial field or region, near its rear face.

According to an additional feature of the invention, improving the absorption rate of the device, the process can also comprise a step of forming, on the front surface, an antireflection and light transmitting multilayer nanostructure having a graded-index profile, designed to couple optically, in a near perfect way, the photovoltaic material and its front face environment.

By way of example, said frontal antireflection nanostructure can consist in a coating as described by Kuo et al. in "Realisation of a near perfect antireflection", OPTICS LETTERS, 2527-2529, Vol. 33, No. 21, Nov. 1, 2008.

Lastly, the present invention also encompasses a photovoltaic device able to exploit high energy photons, in particular UV and visible photons, in addition to IR photons, said device being produced according to the method described before and comprising a slab, wafer or chip of p-type or n-type photovoltaic material produced according to the method also described before, having a top surface intended to be exposed to photonic radiation, having a built-in P-N junction delimiting an emitter part and a base part, having front and rear carrier collection and extraction means and comprising at least one area or region specifically designed or adapted to absorb high energy or energetic photons and located adjacent or near at least one heterointerface, device characterised in that said slab, wafer or chip of photovoltaic material comprises also at least one metamaterial field or region forming a low-energy secondary carrier generation cavity, which is contiguous or proximate to the at least one absorption area or region for the energetic photons and subjected to a built-in or applied electrical field having an intensity sufficient to withdraw and move away the secondary electrons liberated by the primary hot electrons from their initial sites within the concerned metamaterial area or region, at a speed sufficient to prevent their return into said metamaterial region or field, thus forming a substructure performing multistage conversion, wherein the density of divacancies within the metametallic field(s) or region(s) is greater than $10^{18}$ divacancies/cm$^3$, preferably greater than $10^{19}$ divacancies/cm$^3$, most preferably greater than $10^{20}$ divacancies/cm$^3$ and the conduction between the metamaterial and the respectively adjacent n-type material has a time constant which is at the most of the same magnitude than the secondary carrier generation time constant.

The photovoltaic device comprises preferably at least one combined multistage conversion substructure, preferably located at or near the front or top surface of the photovoltaic material forming the active component of the device.

According to additional possible features of the invention, the device can also comprise:

as front collecting and conducting structures, grooved contact strips penetrating down into the at least one amorphous material layer;

on the rear face of the slab, wafer or chip, a featured metal layer designed to perform plasmonic absorption of IR radiations and cooperating with an up-conversion layer and an nanoscale metamaterial field or region located near the rear face;

on the front surface, an antireflection and light transmitting multilayer nanostructure having a graded-index profile;

at least two substructures, at least one located near the top surface and at least one located near the rear face of the photovoltaic material.

Figure 2:
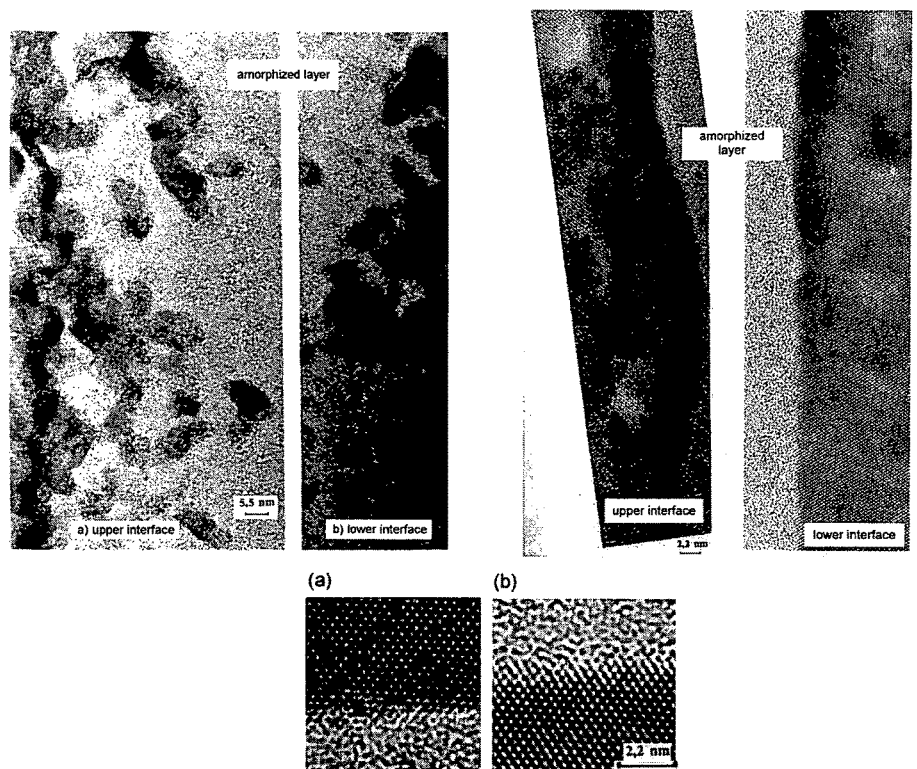
Figure 3:
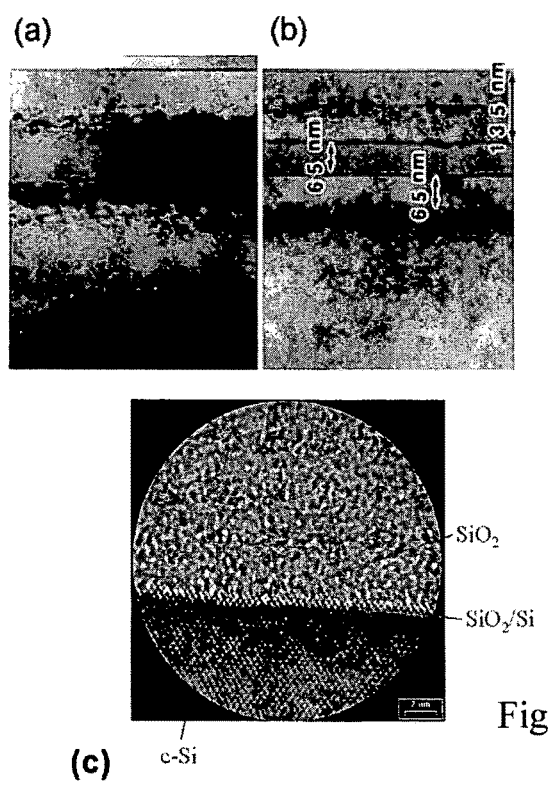
Figure 5:
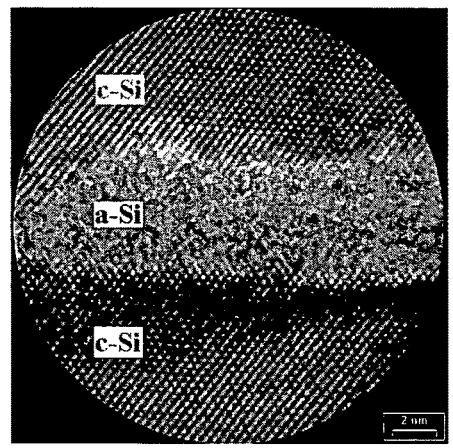
Figure 6:
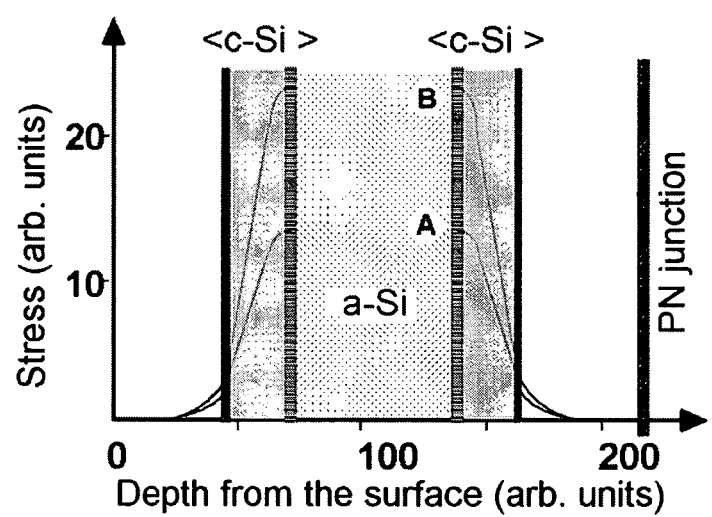
Figure 7:
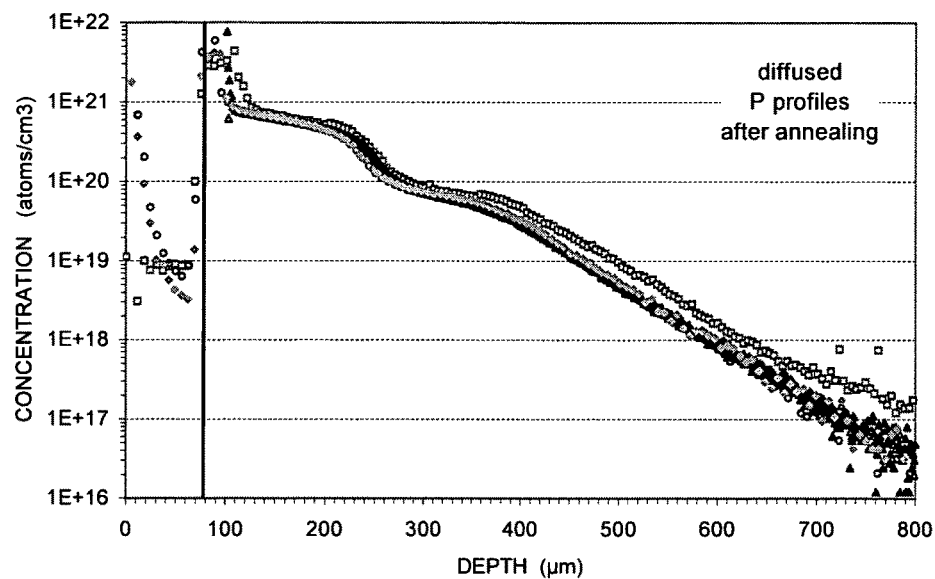
Figure 8:
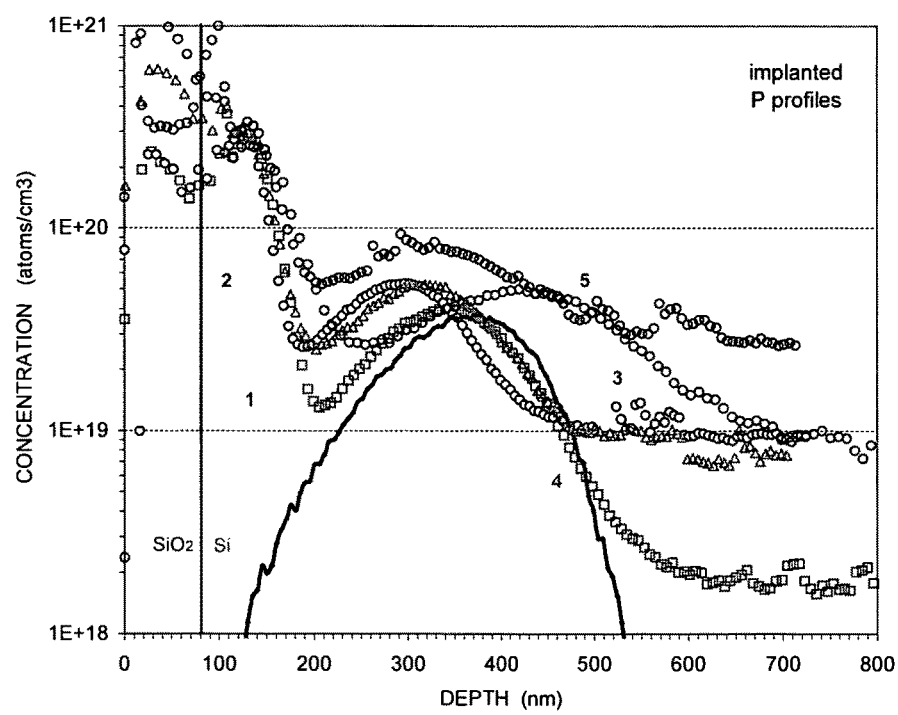
Figure 9:
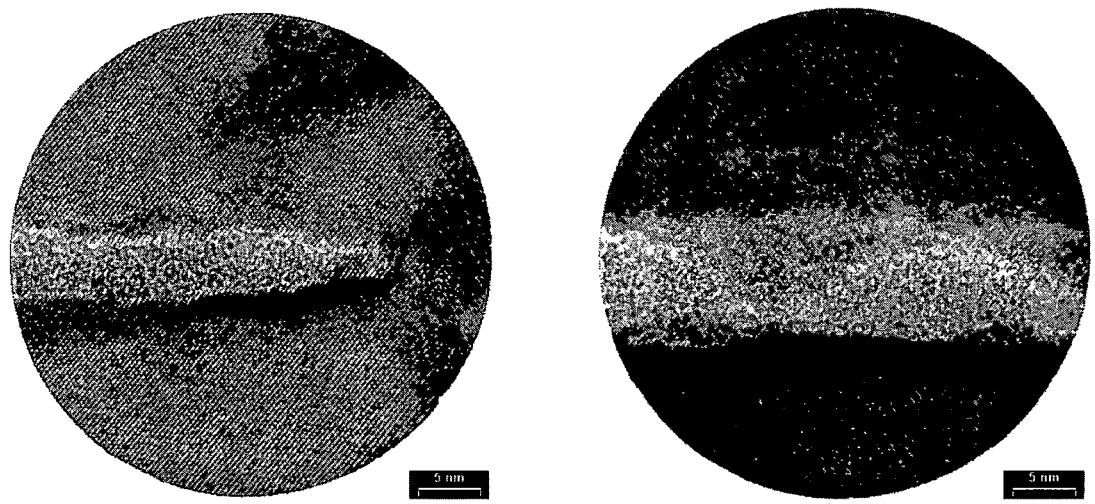
Figure 10:
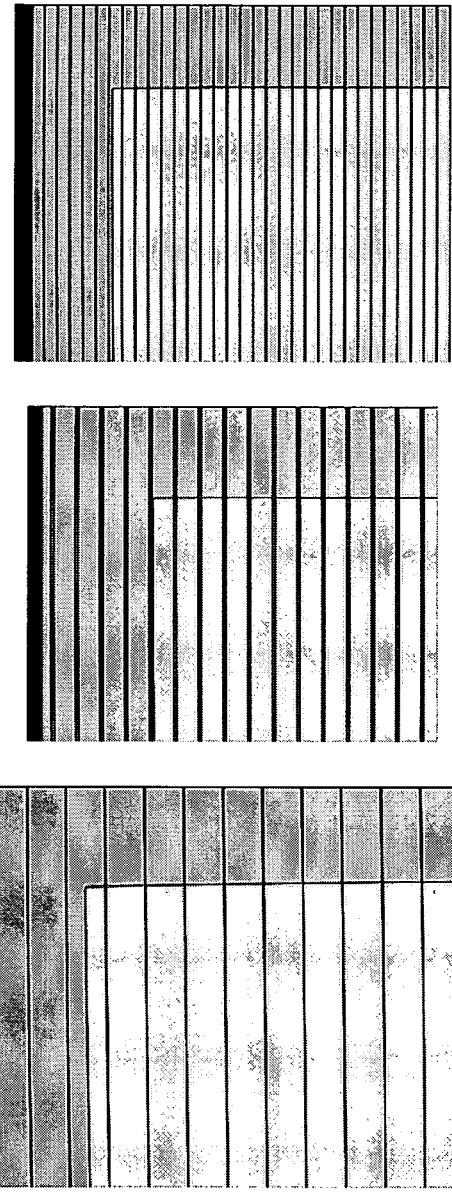
Figure 12:
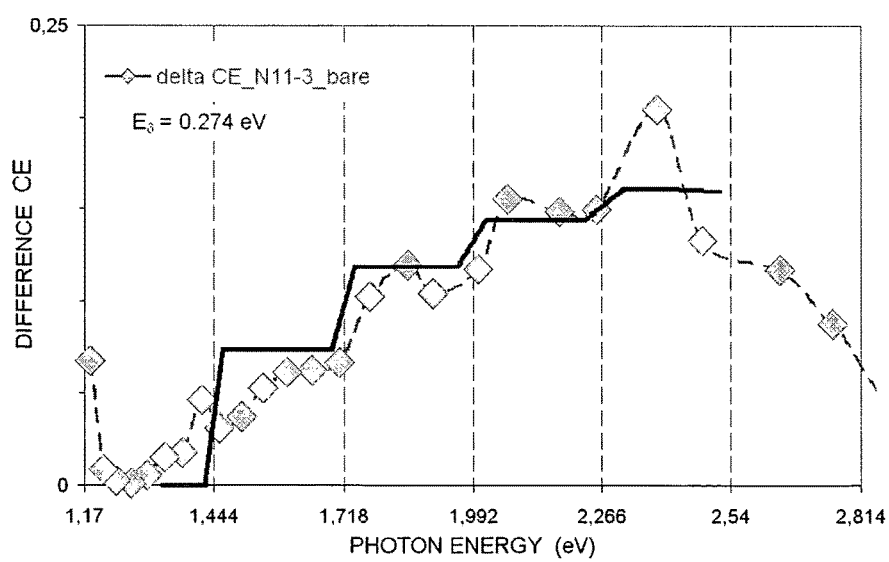

The invention will be better understood thanks to the following description and drawings of different embodiments of said invention given as non limitative examples thereof. In the drawings:

FIG. 1 is a schematic view of a nanoscale Si-layered system containing a metamaterial (<c-Si> nanolayers) of nanostructured silicon which has been obtained by doping, ion implantation and adequate thermal treatment (drawing not to scale). Two upper layers (c-Si and <c-Si>), above the collection limit, represent a surface reservoir filed with free-carriers resulting from doping and light primary and secondary generations;

FIG. 2 shows in the two upper views illustration of structural transformations of the upper and lower c-Si/a-Si heterointerface transition zones realized by an adequate thermal treatment. HREM images show: 1) a structural a-Si and c-Si mismatch just after the ion-implantation processing (left upper image) and 2) the final sharp separation of the two Si (a-Si and c-Si) phases (right upper image) and in the two lower views annealed transition zones of two a-Si/c-Si heterointerfaces, upper (left) and lower (right). The mechanically relaxed crystalline order/disorder transition is on the atomic scale. The Si metamaterial is confined within the strained transition zones;

FIG. 3 shows the resulting a-Si/c-Si heterointerface transformations realized by controlled recrystallisation of the amorphised phase. X-TEM images illustrating the transformation of an amorphised layer with its strained zones: (a) as-implanted, (b) after an adequate thermal treatment at around 500° C. 2D tensile strain within the c-Si appears as darker bands close to the interface (darker zones, appearing further from the interface, correspond to post-implantation extended defects). A similar strain is present also at an excellent SiO$_2$/Si heterointerface after adequate treatment (c);

FIG. 4 is a comparative figure (real image/schematic graph) of a planar multi-interface substructure realized by controlled recrystallisation of the amorphised phase (buried by ion-implantation and post-implantation processing within a crystalline Si) and the corresponding scheme illustrating details of resulting 2D nanoscale Si-layered system. There are three strained nanolayers, denoted <c-Si> (two at active a-Si/c-Si heterointerfaces and one at the superficial SiO$_2$/Si heterointerface), contain a Si metamaterial;

FIG. 5 is a view of an example of a nanostructure after a relatively long thermal treatment (a-Si total thickness is of about 5 nm). The good crystallinity in the recrystallised zones is well visible;

FIG. 6 is a schematic graph showing the distribution of local 2D strains in an as-implanted (A) and an annealed (B) sample. The distributions are normalized to the a-Si thickness (drawing not to scale). The effect has been visualized by X-ray diffraction;

FIG. 7 is a graphical representation illustrating the comparison of phosphorous profiles ($^{31}$P) diffused at 850° C. and measured by SIMS after ion-amorphisation and related processing;

FIG. 8 is a graphical representation illustrating the comparison of doubly implanted phosphorous profiles ($^{31}$P), implantation energies: 15 keV and from the range lying between 100-250 keV, measured by SIMS after ion-amorphisation and related processing. The continuous line shows the implanted phosphorous profile ($^{31}$P) resulting from the Monte-Carlo simulation SRIM code for 180 keV implantation energy;

FIG. 9 comprises two views showing examples (TEM images) of different geometries of Si nanostructures buried within the crystalline Si: left image—discontinuous amorphisation and right image—layer with local circular valley system;

FIG. 10 comprises three views illustrating examples of buried discontinuous amorphisation realized across an implantation mask (by optical microscopy). The remaining crystalline structure appears as the dark line of the width varying between 2 and 10 gm from one image to another. The border band of different grey intensity (at right upper corners) represents the SiO$_2$, frame layer used at this stage of processing;

FIG. 11 is a schematic representation of an example of a two membrane converter: en-membrane (2) represented by the <c-Si> nanostratum of a metamaterial and el-membrane (4) as is the PN junction. The <c-Si> nanostratum divides the emitter into two parts: i) upper, with a hot free electron bath and conducting electrons at near equilibrium energy (1) and ii) lower, with near equilibrium carriers (3). The base (5) occupies the entire bulk under the PN-junction (drawing not to scale). The collected current (c1+c2) is larger than for only conventional conversion (c1);

FIG. 12 is a graphical representation illustrating the multistage conversion mechanism, in particular a step-like difference between measured and simulated conventional CE (diamonds) after optical confinement correction. The conventional CE has been simulated using the experimental data. The step-like continuous line results from the simulation of carrier multiplication with a 0.8 probability. An impurity bandgap narrowing, caused by heavy P-doping, enhances the CE at the lowest photon energies;

FIG. 13 is a schematic view of a crystalline Si wafer containing a buried substructure being able to combine optoelectronic features (not to scale). Nanoscale transformations lead to the superposition of several specific layers and especially a Si metamaterial; three nanolayers denoted <c-Si>; one at the SiO$_2$/Si interface and two at a-Si/c-Si interfaces (labelled in the figure as top and lower active nanostructures). One of the specific effects, i.e. the surface free-carrier reservoir, results from the carrier collection limit (CCL) which appears at the upper a-Si/c-Si interface. Upper graph ignores the free-carrier accumulation (confinement), while the lower graph takes this into account indicating more realistically regions of the strong light absorption. Another specific effect concerns collection properties of photogenerated free-carriers; signalled by collection-carriers and conduction-current arrows, and FIG. 14 is a schematic view of an example of cell with a planar architecture containing one of the possible combinations exploiting the nanoscale Si-layered systems with a Si metamaterial. The arrangement (three substructures within the emitter, base and rear face zone) allows better conversion of specific solar spectrum components taking into account the average penetration depth of photons.

The invention, and more specifically the photovoltaic production method which constitutes the main object of the invention, will be described more precisely, and by way of an example, hereinafter.

The inventive method for producing the photovoltaic material incorporating at least one active substructure with at least one metamaterial continuous or discontinuous formation (region, field or layer) implies local physical transformation which can, for example, be performed by ways of ion implantation and appropriate thermal treatment. This production process can result in various types of metamaterial depending on the process adjustments and conditions, following preliminary studies. It is therefore possible to produce a metamaterial which is adapted to the intended specific application (optoelectronics or photovoltaics).

Several embodiments of the photovoltaic material have been realised by the inventors, which differ from each other by the situation of the metamaterial nanoscale formation <c-Si> (at the SiO$_2$/c-Si interface as in FIGS. 4 and 13 and/or at an a-Si/c-Si interface as in FIGS. 1, 4 and 11), by the doping profile, by the thickness of the superposed nanoformations, by the implantation dose and energy, by the annealing conditions and duration, by the type and quality of the surface treatment, for example.

As illustrated in FIGS. 4 and 13, the SiO$_2$/c-Si interface can first be formed by means of a thermal (sacrificial) oxydation, followed by ion implantation and thermal treatment and a final passivation step. The thermal treatment varies depending on the requested properties, for example by performing first a continuous annealing and then finishing with sequential cycles. Through all these production steps, the photovoltaic material is subjected to control measurements in order to verify the result of the foregoing production step and to adjust the parameters of the following production step, during the production process. The survey of the production of the process can in particular be realised by means of successive comparisons of production samples with standards corresponding to the concerned final application.

The main common feature of every photovoltaic material produced according to the invention consists in the non linearity of their optical and electronic properties, obtained by exploiting the physico-chemical properties of Si or GaS material incorporating and at least one nanoscale layer system.

The new optoelectronic properties can be in particular illustrated by the absorption coefficient (control parameter), which is no longer linear but varies in quite a wide range depending on the optical excitation intensity and the doping density. As an illustrative example, the inventor have measured an absorption coefficient value, at 800 µm, forty times bigger in a metamaterial according to the invention than in crystalline silicium (i.e. greater than the absorption coefficient value of amorphous silicium).

In order to obtain a nanostructured metamaterial silicium, the silicium crystal must be locally transformed by means of superposition of several physical effects reaching uncommonly high intensities (see FIG. 1).

The involved factors are: doping level, intensity of the local mechanical constraint and of the intrinsic electrical field, type, density and electric charge state of the structural defects. Such effects can appear at the heterointerface dividing two different phases (amorphous and crystalline) of the semiconductor which result from a cynetic treatment preserving the interatomic links through the interfacial plane (c-Si/a-Si).

FIGS. 2 and 3 illustrate the structural transformation at atomic level sustain by the transitional areas of the heterointerfaces during thermal treatment. When a epitaxy in solid phase procedure is performed, the separation of the phases occurs on a atomic distance nearly without pending links. The purification of the phases is achieved in a reproducible manner and by preserving the strong local mechanical constraints at the interface and the density and distribution of the structural defects (in the requested state and quantity).

The technological production process must take into account, on the one hand, the structural transformations such as homogenisation of the materials of the phases and disappearance of the reciprocal inclusion of the opposed phases and, on the other hand, other fundamental physical factors requested for a successful metamaterial transformation such as, for example, the intensity of the mechanical constraints, density and distribution of the desirable structural defects, the state of charge of these defects, the density and/or the distribution of the doping atoms after annealing.

Most of the specific properties of the material cannot be visualised by a microscopy and particular characterisation procedures and means indicated before must be used to obtain the photovoltaic material according to the invention.

Concerning the thermal treatment to be applied, it should be noticed that the duration and the intensity of the thermal cycles depend, for a given application, on the depth of the buried nanoscale system, on its level of doping, on the requested density of defects and on the optoelectronic activity of the active defects.

The applied thermal treatment is basically determined by the desired result taking into account the preceeding implantation step and the preservation of the constraints mentioned before.

As described for example in the foregoing US and WO documents, the doping profile shows an impurity concentration peek at the depth of each active substructure, whereas the thermal treatment finalises each substructure by levelling the interfaces and setting the depth and thickness of the substructures, as well as activating the doping impurities and the built-in fields (in the transition area) and curing the implantation defects with a limited effect at each substructure.

As indicated before, the characterisation of the photovoltaic material, i.e. especially of the searched for active(s) substructure(s), is preferably performed during and at the end of the production process. The characterisation can include optical measurements (photoluminescence and reflection) and/or electronic measurements (current, voltage, stored charge, capacity). These measurements can be performed at different wavelengths of incident photonic radiations (400 µm, 700 µm, 800 µm), possibly by inclined excitation, and include comparison steps with especially made standards and precollected data.

Examples of approaching thermal treatments, which could be adapted to be useful in the present invention, are described in WO-A-96/02948 and WO-A-01/39281.

The various conditions and factors of the production process can advantageously be simulated by using commercially available simulation programs for ion implantation simulations (such as SRIM).

As indicated before, the photovoltaic material according to the invention can comprise only one active substructure in the form of a system of nanolayers including at least one metamaterial layer, having a continuous or discontinuous configuration, and located in the emitter part or in the base part of the material (see FIGS. 1 and 11).

In an other embodiment, said photovoltaic material can also comprise one active substructure within the emitter part and at least a second active substructure within the base part (see FIG. 14).

Furthermore, a supplemental active substructure can be contemplated at or near the front or top surface of the photovoltaic material and/or at or near the rear face of said material (see FIGS. 4, 13 and 14).

A practical, non limitative, example of photovoltaic material produced according to the invention is set forth in the following specification.

A planar electronic cavity (total surface amorphisation) is formed between the $SiO_2$/Si interface and a PV metamaterial layer buried at 27 nm depth.

Total surface amorphization (final) of relatively low thickness of 27 nm was obtained starting from the amorphisation (initial) layer of more than 200 nm-150 keV P ion-implantation energy—by two successive processes: initial relatively long heat treatment—the solid phase epitaxy—and then by RIE, which introduces, with share additional thinning, a strongly damaged superficial nanolayer.

The electrons of the secondary generation come from the single metamaterial nanolayer buried under the 27 nm amorphisation. The collection of cold electrons is then made through the electronic cavity with inevitable losses in the 27 nm a-Si and in the damaged superficial nanolayer. So their collection efficiency is a function of the incident flux intensity and of incident flux spectral composition. These electrons are drained towards surface thanks to the electric field which direction is imposed by the PN junction. This field is not optimal to force the sufficiently short time-constants compared to the probability of the return of secondary electron to its original site. It is one of the limitations of the metamaterial formed in rear part of the amorphisation, compared to the top metamaterial layer (having a bad electric orientation).

The hot or primary electrons are mainly generated in the a-Si layer (place of privileged absorption of energetic photons) and thus are also obliged to cross amorphized material by losing part of their additional energy (greater diffusion in the a-Si that in the c-Si).

Despite these limitations, the collection efficiency (CE) is relatively important (exceeding 100%) except the shortest wavelengths (UV) for which superficial absorption is particularly strong, penetration depth very low and free path of hot electrons longest.

The mobility of the electrons in a-Si is also relatively low (of the order of $cm^2$/Vs). The photogeneration of middle and large intensity induces the stored/confined charge which is at the origin of the light-induced opacity.

Additional factors to be considered or possible features are:

stability, uniformity, continuity, sealing, energy flux: of light and of electrons, collection efficiency, electronic cavity (hot electron imprisonment) with one or two (several) energy-population converter walls, collection vibrations (plasmons), layers with great conductivity (high temperature superconductivity).

As exposed before, each metamaterial nanolayer (thickness less than 10 nm) is intimately placed next to at least one buried interface.

The controlled physical transformation occurs at nanoscale and result from the optimised superposition of several local fields of high intensity, namely: a mechanical field, an electric field, a structural defect field and a doping field, which are configured and designed to word together.

In particular, the secondary generation phenomenon results from the superposition of the structural defects (secondary generation centers, confined within a limited volume of the transitional zone of a buried interface), rightly located and in the right electric charge state with a strong electric field, which is needed to ensure the transport of the secondary electrons and the regeneration of the active centers. The confinement of the free carriers (high density free carrier gas) within a reservoir (potential well) located, for example, at or near the top surface, can be found as being beneficial or harmful depending on the concerned final application. Said application of the photovoltaic material also imposes the type of the metamaterial which is requested and thus its production process steps and conditions.

The variety and properties of the metamaterial obtained according to the invention are quite vast, but can be controlled by adjusting accordingly the place of the metamaterial formation (at or near the top surface, buried more or less within the photovoltaic material), the doping species, the type of impurities, the configuration of the interface, the type of the interface (for example a-Si/c-Si or $SiO_2$/c-Si) and the local mechanical constraints.

As the metamaterial can experience a wide range of variation of properties (for example of the gradients, the non linearities), it is necessary to provide adapted control means and protocols at nanometric scale, preferably non destructive and able to be implemented in situ. Optical control methods seem the most appropriate.

In case of photovoltaic conversion in particular, the membrane forming metamaterial nanoformation should be embedded in a environment useful for the electronic transport of the electrons at equilibrium energy. The best solution consists in forming an electronic/thermodynamic cavity so that each collision of a hot electron with the membrane wall results in the generation of an additional electron having an energy near equilibrium, which is instantaneously dragged outside of its generation area by an adequate electric field (preferably built-in). The electronic cavity should be arranged as near as possible to the front (exposed) face of the converter device, in order to absord as many energetic photons as possible, i.e. so as to recover as much cinetic energy of hot electrons resulting from the superficial absorption of the energetic photons (visible and UV) before their thermalisation (short time constants, of the order of the nanosecond).

Front and rear collecting means for such converter devices are known in general to the person skilled in the art.

A specific example of photovoltaic material obtained is now described in relation to FIGS. 11 and 12.

As described before, the invention provides in particular a method to produce nanostructures semiconductor material, more particularly as mentioned hereinafter by way of example, nanostructured Si produced by amorphising ion-implantation and consecutive thermal treatment (see publication referenced [1] hereinafter).

On the one hand, the nanoscale material engineering (using even structural defects and free-carrier/matrix relations (see publication [3]) offers intense physical transformations of usual c-Si leading to Si-metamaterials. On the other hand, the superposition of different conversion mechanisms, often paradoxical on the macroscale, expands a single act of photon absorption into a conversion cycle, i.e. the multistage processing (see publications [4] and [2]).

As an exemplary and experimental embodiment, the inventors have produced a sample showing that the addition of a Si metamaterial in the emitter leads to a hidden tandem cell, i.e. an inclusion of a complementary converter in the conventional device. Resulting double converter contains two internal membranes which separate: carriers of different signs (electron—hole separation) and carriers of different energies (separation of electrons with different energy), see FIG. 1.

The conventional converter works due to interband electron transitions that create electron-hole pairs. This is a primary generation (conversion) of bipolar nature (c1-current in FIG. 11). The lower membrane (called here the electrical membrane or el-membrane) is realised by the PN junction. It imposes the internal carrier separation (electrons from holes) and their unidirectional movement according to the sign of their electric charge.

The complementary converter cools hot electrons (generated by energetic photons) through a secondary generation (conversion) of additional electrons (c2-current in FIG. 11). The second membrane (called here the energy membrane, en-membrane or <c-Si> nanostratum) is constituted by the Si metamaterial and by the c-Si/a-Si interface. In the first approximation, the en-membrane separates carriers of the same electric charge (electrons) but with different kinetic energy. The collision probability of hot electrons with low-energy (extrinsic) centers is high because the centers distributed within the en-membrane are numerous and have a large scattering cross section. Each center has one weakly bonded electron, the liberation of which consumes a part of the kinetic energy of the hot electron.

The arrangement of the device space plays an important role because particularly short time constants are involved in the processing. The penetration depth of hot electrons formed by highly energetic photons near the surface has to be more limited by the en-membrane than by scattering on semiconductor matrix. Secondary generation can be observed only when the time constant for this process is shorter than that of intraband thermalisation (the latter leading to photon generation and to thermal agitation, i.e. to heating).

The collisional liberation of electrons from lattice sites by hot electrons leading to more than one collectable electron is known as the impact ionisation (see publication [5]). It has been demonstrated experimentally in the crystalline Si in 1993 by Kolodynski et al. (see publication [6]). The kinetic energy of an electron liberated by impact is close to that of equilibrated carriers (at 300 K, $v \approx 10^7$ cm/s; thus $E = 0.5\ mv^2 \approx \ldots\ eV$). The energy of interband secondary generation is too high (about 3.5 eV) to be beneficial for solar light conversion to electricity (see publication [7]). Efficient secondary generation from solar photons requires about an order of the magnitude lower specific energy (much less than the Si bandgap of 1.1 eV), i.e. of about 0.3-0.4 eV (see publication [8]).

The corresponding centers with low-energy electron liberation, of about 0.274 eV, have been grafted within a heavily n-type doped metamaterial layer (see publication [9]). The main differences of such a system working similarly to the well known impact ionisation are its specific energy and the geometrical space arrangement of the emitter.

In general, hot electrons cannot be collected because their high kinetic energy makes them insensitive to the applied electric field and also because of the small area of the collecting electrodes (less than 5% of the front face). In moving to the semiconductor/passivation layer interface at the front face they are reflected; moving in the other direction towards the buried a-Si/<c-Si> interface they are cooled. In the bulk of the upper emitter they are unavoidably partially thermalised.

Secondary electrons with low kinetic energy (corresponding to the device temperature) are sensitive to the applied electric field. Because the en-membrane has its own built-in electric field (directed according to that of the PN junction), unidirectional movement of secondary electrons into the front face is imposed and, as a consequence, a sufficiently rapid separation from their site of creation is guaranteed.

Electron extraction breaks the local electric neutrality, like in the PN junction. To restore the previous state, i.e. to regenerate the center, another electron arrives across the a-Si/<c-Si> interface from the lower emitter. In the P-type base the current continuity is assumed by hole conduction (c2-current in FIG. 11).

The magnitude of the additional population depends on the absorbed photon energy and on the en-membrane dynamics. The collected current results from a complex game of different time constants describing the carrier thermalisation, electron transport, electron extraction and center relaxation. When the regeneration of the center is sufficiently fast, the electron multiplication becomes efficient enough to appear as steps on the spectral curve of short-circuit current versus photon energy; the larger the photon energy, the higher the multiplication order. The explicit apparition of multiplication orders results from a soft multistage conversion.

The experimental demonstration of new mechanisms has been carried out on an amorphised-Si/Si-metamaterial/crystalline-Si (a-Si/<c-Si>/c-Si) sandwich architecture (see FIG. 11). The test samples were made by a total surface amorphisation of a c-Si wafer by ion implantation and succeeding thermal treatment (see publication [10]). The thermal processing leads to a single buried a-Si/<c-Si> interface and adjacent metamaterial nanostratum. This structure has been chosen to avoid a second a-Si/<c-Si> interface appearing in samples with a buried a-Si nanolayer (see publication [10]).

In the case of buried amorphisation nanolayer, such as shown in FIG. 13, one of the a-Si/<c-Si> interfaces (the upper one) presents a potential barrier that blocks carrier collection from the upper emitter (see publication [11]). In other words, it works as a carrier collection limit (CCL) confining carriers within the upper emitter (see publication [11]). This confinement has to be reduced or avoided to observe increased PV conversion, for example, by using weak excitations (with the CCL) or by fabricating a structure without any CCL.

The experiment made by the inventors is the simplest possible assuming however the necessary and sufficient data set. Sample differences were limited to the only two parameters: thickness of the amorphised layer and the state of the front face passivation. Both are easy to control in the multilayer architecture of the photovoltaic material of the sample. In this way, possible differences of sample design and fabrication as well as the experimental procedure and interpretations are avoided.

First, the thickness of the amorphised layer can be modified by solid state epitaxy (determined by the annealing time) (see publication [12]). This leads to a family of samples differentiated only by the amorphisation thickness.

Second, the state of the semiconductor surface can be controlled by the surface passivation. In particular, two extreme cases are possible: an excellent electronic passivation and an absence of passivation combined with a heavily damaged superficial nanolayer. The surface recombination rate determines the free-carrier accumulation (or not) within the a-Si layer.

The experiment was divided into two stages. At the beginning, the samples with an amorphised layer were covered with a 70 nm $Si_3N_4$ passivation layer. The passivation quality was particularly looked after.

Following a complete sample characterisation, this passivation was etched by reactive ion etching (RIE). In this way, all devices studied conserved an identical internal architecture, i.e. the strata which form the base, the PN junction transition zone and the lower c-Si emitter. The rear Al grid electrode, $SiO_2$/Al mirrors and back surface field also remained the same after RIE. Small differences in c-Si thickness after different annealing times are negligible from the optoelectronic viewpoint. Electron energy loss spectra (EELS) show that the metamaterial nanostratum of metamaterial conserves its about 10 nm thickness independently of the annealing time.

The main experimental results which could be reported were obtained by detailed measurements of spectral response and related reflectivity of samples with a bare front face. This characterisation required a good absolute precision or a comparison with corresponding reference devices. The setup of spectral response used a system of bandpass filters and a conventional reference cell (having an excellent conversion efficiency of 20%) with its data files from a bureau of standards. The optical reflectivity was measured using a half spherical apparatus and a standard reference. The measurement error, after thermal stabilisation, was smaller than 2%.

New effects appear on collected currents and related collection efficiencies (CE). A comparison of CE from test samples with those from their conventional counterparts demonstrates a specific step-like behavior (see FIG. 12). The only parameter distinguishing our test devices represented on FIG. 1 from corresponding conventional cells is the nanostratum of Si-metamaterial placed on the c-Si side of the buried a-Si/c-Si interface. The CE of a-Si/c-Si sandwiches, without any metamaterial nanostratum, could be simulated due to the knowledge of the absorption coefficients of amorphised Si (a-Si (see publications [13] and [14])) and crystalline Si (c-Si (see publication [15])).

The absorption coefficient of the amorphised zone of test devices is nonlinear and depends on the surface passivation [18, absorption coefficients]. The better the passivation, the greater the absorption coefficient. The value of the absorption coefficient of the samples investigated varied between two data sets reported in the literature for amorphous Si thin films [13, 14, absorption coefficients of the amorphised Si material]. In the same device with different state of the semiconductor surface the only difference that can explain the variation of absorption coefficient is the free-carrier accumulation in the a-Si layer. A bare front face accelerates surface recombination by reducing the density of accumulated carrier population. A carrier accumulation in the a-Si layer appears due to carrier injection from the c-Si into the a-Si. This injection leads to the Gunn Effect, i.e. carrier accumulation because of the decreased electron mobility in the a-Si. Electron mobilities in crystalline and amorphous Si are respectively, about 1000 cm$^2$/Vs and 1-10 cm$^2$/Vs.

To a first approximation, the amorphous layer can be treated as a dead zone for PV conversion, i.e. all photons absorbed in this zone generate uncollectable free-carriers. However, contrary to its electronic behavior, the accumulated population is optically active. The CE of the corresponding conventional a-Si/c-Si sandwiches was simulated using a two layer stack with our experimental data for amorphised and crystalline materials and supposing a perfect a-Si/c-Si interface.

FIG. 12 shows the CE difference obtained by the subtraction of the simulated (smooth) conventional CE from its measured (nonlinear) counterpart. The amorphisation thickness (dead zone) of the bare sample was 26.6 nm. The low-energy generation and carrier multiplication are visible as a step-like effect or a multistage process. A higher photon energy gives a larger additional population by several generating collisions. The same FIG. 12 shows steps of a corresponding simulated multiplication with a secondary generation probability of 0.8 (see publication [16]).

The first multiplication step appears in the photon energy range lying between 1.444 and 1.718 eV. Higher multiplication orders (second, third, fourth) are well visible, with a specific energy of 0.274 eV. One energetic photon can thus create two, three, four or even more electrons by successive electron-liberating collisions with defects leading to multiple transitions from a defect energy level into the indirect conduction band.

The experimental curve in FIG. 12 requires some complementary comments. Because some of the infrared photons can reach the excellent SiO$_2$/Al mirror covering about 95% of the rear surface, a correction for the conversion in the c-Si is necessary. The effect known as the optical confinement increases the CE due to multiple crossing of the active zone by reflected IR photons. The rear Al/c-Si electrode had the same grid shape as that at the front face. The spaces between the metal fingers were passivated by the SiO$_2$ and the external rear side was covered totally by an Al layer. Another specificity of the test devices is the strong relative improvement of the CE in the IR range (hv<1.25 eV) resulting from the bandgap narrowing due to the heavy P doping (more then 10$^{20}$ cm$^3$).

FIG. 12 shows also two specificities of conversion in the a-Si/c-Si sandwich. Hot electrons with enough additional energy generated in the upper amorphous emitter require photons of relatively higher energy than those in c-Si due to the larger band gap in a-Si; $E_{g\_a\text{-}Si}$>1.54 eV [17, Tauc, min bandgap of amorphous Si]) in comparison with c-Si, $E_{g\_c\text{-}Si}$=1.17 eV (see publication [17]). For this reason, the first step (first multiplication order, i.e. 1.444-1.718 eV) is proportionally incomplete in comparison with its simulated image. The secondary generations that appear originate from less energetic photons reaching the <c-Si> nanolayer.

Finally, the "noise" of the experimental curve results from the method used for the monochromatic light excitation. Because the optoelectronic behaviour of samples is non linear, the experimental points depend on the bandpass filter, as the light intensity varies from one filter to another.

As demonstrated experimentally hereinbefore, the invention provides a low-energy carrier generation and multiplication in a Si-metamaterial resulting from nanoscale transformations of the crystalline Si. Several specific effects have been grafted into the conventional emitter. The secondary generation and multiplication take place on the c-Si side of the a-Si/c-Si interface transition zone (<c-Si> nanolayer) representing a Si-metamaterial with strongly nonlinear optoelectronic features (see publication [18]). The concept of the test devices (FIG. 11) permitted reduction of light induced opacity. The effects could be shown under near solar intensities with relatively simple experiments realised on specially conceived amorphised structures without any passivation layer.

In a multilayer structure with a buried amorphisation (FIG. 13), where there are two Si-metamaterial layers, one of them (the upper one) works in an opposite manner by supplying the surface reservoir with an uncollectable additional population. This population amplifies the light-induced opacity reducing, and as a consequence, the beam transmitted into the lower Si-metamaterial which produces a collectable additional population. The upper <c-Si> nanolayer hides the additional generations from the lower <c-Si> nanolayer due to their opposing polarisation.

The additional current in the external circuit signifies that the new effects have extremely rapid dynamics. The relaxation of hot electrons in the Si-metamaterial layer is greatly modified compared to the relaxation of free electron-hole pairs formed in the bulk Si. For this reason, the hot carriers colliding with the en-membrane, lose their kinetic energy usefully on an additional free-carrier population of near-equilibrium energy. Multiple secondary generations, depending on the incident photon energy, allow the multistage conversion. A detailed PL/PLE measurement has confirmed the extremely rapid dynamics of fruitful hot electron collisions by a partial extinction of the luminescence.

A similar conversion has been observed previously in superficial <c-Si> nanostrata with about 5-10 nm thickness under soft UV (400 nm wavelength). The best results under weak illumination (10$^{13}$ photons/s/cm$^2$) gave 135 electrons per a 100 absorbed photons [8, Hawaii 2006]. In this case, the secondary generation centers were formed in the absorption zone because the UV absorption is strictly limited to the superficial region. The overlapping of absorption and secondary generation zones leads to an extremely short delay (picoseconds) between the hot carrier generation and its collision with a secondary center.

The two membrane system is adapted to photons from the solar spectrum. The low-energy generation (with the specific energy $E_\delta$=0.274 eV) and multiplication with a relatively high probability of 0.8 (see publication [16]) allow the thermodynamic efficiency of more than 60% (see publication [19]). The experiments reported here and illustrating the results of the inventive production process open the way to different applications, especially in the areas of nanophotovoltaics and ultrahigh efficient PV conversion.

The teachings and contents of the following publications [1] to [19], already quoted hereinbefore, are incorporated in the present specification by reference:

[1] Several tutorials and papers presented on new photovoltaics and nanophotovoltaics on the 33$^{rd}$ IEEE Photovoltaic Specialists Conference, May 11-16, 2008, San Diego, Calif., USA

[2] Wolf, M., Brendel, R., Werner, J. H., Queisser, H. J. *Solar cell efficiency and carrier multiplication in $Si_{1-x}Ge_x$ alloys*, J. Appl. Phys. 83, 4213-4221 (1998)

[3] Supancic, P., et al. *Transport analysis of the thermalization and energy relaxation of photoexcited hot electrons in Ge-doped GaAs*, Phys. Rev. B 53, 7785-7791 (1996)

[4] Kuznicki, Z. T., Meyrueis, P., *Multistage PV Conversion using a Metamaterial based on the Nanostructured Si*, 23$^{rd}$ European Photovoltaic Solar Energy Conference and Exhibition, 1$^{st}$ to 5 Sep. 2008, Proceedings pp

[5] Hodgkinson, R. J., *Impact Ionization and Quantum Efficiency in Silicon*, Proc. Phys. Soc. 82 58-64 (1963);

Ross, R. T., Nozik, A. J., *Efficiency of hot-carrier solar energy converters*, J. Appl. Phys. 53, 3813-3818 (1982) and Landsberg, P., Nussbaumer, H., Willeke, G., *Band-band impact ionization and solar cell efficiency*, J. Appl. Phys., 74, 1451-1452 (1993)

[6] Kolodinski, S., Werner, J. H., Witttchen, T., Queisser, H. J. *Quantum efficiencies exceeding unity due to impact ionization in silicon solar cells*, Appl. Phys. Lett. 63, 2405-2407 (1993)

[7] J. H. Werner, S. Kolodinski, and H. J. Queisser, *Novel optimization principles and efficiency limits for semiconductor solar cells*, Phys. Rev. Lett. 72, 3851-3854 (1994) and R. Brendel, J. H. Werner and H. J. Queisser, *Thermodynamic efficiency limits for semiconductor solar cells with carrier multiplication*, Sol. En. Mat. Sol. Cells 41/42, 419-425 (1996)

[8] Kuznicki, Z. T., Meyrueis P., *Low Energy Free-carrier Generation in Nanoscale Si-layered Systems: Experimental Evidence*, Proceedings of 4$^{th}$ World Conference on Photovoltaic Energy Conversion (WCPEC-4), May 7-12, 2006, Hawaii, USA, pp. 107-111

[9] Kuznicki, Z. T., *Enhanced Absorption and Quantum Efficiency in Locally Modified Single-Crystal Si*, Appl. Phys. Lett. 81, 4853-4855 (2002)

[10] Kuznicki, Z. T., *Multiinterface Si Solar Cells with Active Substructures and Active Interfaces*, 26$^{th}$ IEEE Photovoltaic Spec. Conf., Anaheim, USA, 29 Sep.-3 Oct. 1997, Proceedings, pp. 291-294

[11] Z. T. Kuznicki et al, "Solar light-induced opacity of Mind cells", 1-4244-0016-3/06, IEEE, 2006

[12] Csepregi, L., Kennedy, E. F., Gallagher, T. J., Mayer, J. W., Sigmon, T. W., *J. Appl. Phys.* 48, 4234-4240 (1977)

[13] Jellison, Jr. G. E., Chisholm, M. F., Gorbatkin, S. M., *Optical functions of chemical vapor deposited thin-film silicon determined by spectroscopic ellipsometry*, Appl. Phys. Letters 62, 3348-3350 (1993)

[14] SOPRA, Data base of refraction indices

[15] Green, M. A., Keevers, M. J., *Optical properties of intrinsic silicon at 300 K*, Prog. Photovolt. Res. Appl. 3, 189-192 (1995)

[16] Kuznicki, Z. T., Meyrueis, P., *Multistage PV Conversion using a Metamaterial based on the Nanostructured Si*, 23$^{rd}$ European Photovoltaic Solar Energy Conference and Exhibition, 1 to 5 Sep. 2008, Proceedings pp

[17] Vardenay, Z., Tauc, J. *Hot-carrier thermalization in amorphous silicon*, Phys. Rev. Lett. 46, 1223-1226 (1981)

[18] Kuznicki, Z. T., Meyrueis, P., *Multistage PV Conversion using a Metamaterial based on the Nanostructured Si*, 23$^{rd}$ European Photovoltaic Solar Energy Conference and Exhibition, 1 to 5 Sep. 2008, Proceedings pp

[19] Kuznicki, Z. T., Capot, F., de Unamuno, S., *Photovoltaic Conversion with Multiplication: Thermodynamic Limits for Any Impact Energy*, 2$^{nd}$ World Conference on Photovoltaic Energy Conversion (WCPEC), Vienna, Austria, 6-10 Jul. 1998, Proceedings pp. 80-83 and Ley, M., Boudaden, J., Kuznicki, Z. T., *Thermodynamic Efficiency of an Intermediate-band Photovoltaic Cell with Low Threshold Auger Generation*, J. Appl. Phys. 98, 044905 (2005).

The present invention is of course not limited to the preferred embodiments described and represented herein, changes can be made or equivalents used without departing from the scope of the invention.

The invention claimed is:

1. Method for producing a photovoltaic material able to absorb and exploit high energy or energetic photons, comprising the steps of:

a) providing the photovoltaic material made of at least one inorganic crystalline semiconductor material, comprising Si or GaS, the photovoltaic material having a top surface intended to be exposed to photonic radiation, having a built-in P-N junction delimiting an emitter part and a base part and comprising at least one area which is adapted to absorb high energy or energetic photons located adjacent or near at least one hetero-interface;

b) generating structural defects within said emitter and/or base part of the photovoltaic material consisting of divacancies able to function as low-energy secondary generation centers grouped together in at least one nanometric formation and persistent under production process and photovoltaic conversion conditions;

c) introducing n-type impurities, comprising phosphorus or arsenic, to a first region of said photovoltaic material in order to put the divacancies into an electrical charge state in which they are saturated with weakly bonded electrons and to provide increased conduction within said first region; amorphizing at least a portion of the semiconductor material in order to create the at least one area adapted to absorb high energy or energetic photons, and then preserving any structural defects generated during amorphization during subsequent production steps; and performing at least one thermal treatment step of the photovoltaic material so as to cause recrystallization of the semiconductor material; wherein steps b) and c) are performed in such a way that they result in at least one semiconductor based metamaterial region being created as a transitional region of the at least one hetero-interface, in an area located contiguous or proximate to the at least one area adapted to absorb high energy or energetic photons, wherein absorption in the at least one area adapted to absorb high energy or energetic photons occurs at wavelengths including at least a range which causes thermalization of primary electrons liberated directly by said energetic photons and which collide with metamaterial low-energy generation centers liberating secondary generation electrons in a multistage processing, the order of which depends on remaining energy kept by the primary electrons at the moment of their generation collision;

d) providing a built-in electric field or applying an electric field which encompasses or extends over said at least one semiconductor based metamaterial region and shows an intensity sufficient to withdraw and move away said liberated secondary generation electrons from their initial sites within the at least one semiconductor based metamaterial region, and wherein steps b) and c) are performed in such a way that a density of divacancies within the at least one semiconductor based metamaterial region is greater than $10^{18}$ divacancies/cm$^3$.

2. Method according to claim 1, wherein: the divacancies are generated by an energy beam.

3. Method according to claim 1 wherein: said at least one thermal treatment comprises one initial continuous annealing step, following by at least one cycle of successive discontinuous annealing sequences.

4. Method according to claim 1, further comprising the step of: performing in situ at least one non-destructive characterization and control step of the photovoltaic material during and/or at the end of steps a) through d).

5. Method according to claim 4, wherein the at least one non-destructive characterization and control steps includes reflection or absorption measurements at different wavelengths and of comparison with standard or reference samples, using stored precollected reference data.

6. Method according to claim 4, wherein the at least one non-destructive characterization and control steps includes electric parameter measurements at different wavelengths and of comparison with standard or reference samples, using stored precollected reference data.

7. Method according to claim 1, further comprising the step of: forming one continuous or discontinuous semiconductor metamaterial layer intimately associated with the at least one semiconductor based metamaterial region, the one additional continuous or discontinuous semiconductor metamaterial layers located at or near a top surface of the at least one semiconductor based metamaterial region, with both the one continuous or discontinuous semiconductor metamaterial layer and the at least one semiconductor based metamaterial region together forming a front substructure.

8. Method according to claim 1, further comprising the step of: forming, simultaneously or in successive production cycles, at least two continuous or discontinuous semiconductor metamaterial nanoscale layers, at least one of which is buried within a thickness of said photovoltaic material in the emitter or base part and intimately associated with the at least one semiconductor based metamaterial region the at least two continuous or discontinuous semiconductor metamaterial nanoscale layers comprising n-type doping impurities, comprising phosphorus or arsenic, and forming, with the at least one semiconductor based metamaterial region a substructure.

9. Method according to claim 7, wherein the at least one semiconductor based metamaterial region comprises a layer having a thickness of between 10 nm and 50 nm, and a width of the one continuous or discontinuous semiconductor metamaterial layer is less than 15 nm.

10. Method according to claim 8, wherein: the amorphizing step and at least one thermal treatment step of step c) are performed through an adapted implantation mask so that the at least one semiconductor based metamaterial region and the at least two continuous or discontinuous semiconductor metamaterial nanoscale layers form together a substructure extending parallel to the top surface of the photovoltaic material.

11. Method according to claim 8, wherein: the amorphizing step and at least one thermal treatment step of step c) are performed through an adapted implantation mask so that the at least one semiconductor based metamaterial region and the at least two or discontinuous semiconductor metamaterial nanoscale layers form together a substructure extending inclined to the top surface of the photovoltaic material.

12. Method according to claim 2, wherein: the at least one thermal treatment step of step c) consists of laser annealing, rapid thermal annealing or rapid thermal processing combined with epitaxial layer deposition to adapt a geometry in terms of disposition, distances, thermalization restraints and time constant optimization.

13. Method according to claim 10, further comprising the step of: forming locally implanted amorphized conductive material projections in the shape of columns or bars, extending from the substructure towards the top surface.

14. Method according to claim 1, wherein said step a) comprises the steps of: providing the photovoltaic material in the form or a slab, wafer or chip with at least one active substructure comprising the at least one area adapted to absorb high energy or energetic photons; forming front and rear conductive structures on said slab, wafer or chip able to extract carriers generated within the photovoltaic material; and subjecting a front and/or rear surface of said slab, wafer or chip to at least one additional treatment in order to alter reflection and/or conversion properties.

15. Method according to claim 14, further comprising the step of: forming front conductive structures comprising grooved contact strips penetrating down into the at least one substructure.

16. Method according to claim 14, further comprising the step of: forming on a rear face of the slab, wafer or chip, a featured layer able to perform plasmonic absorption of infrared radiations and up-conversion into green or blue radiation.

17. Method according to claim 16, wherein: the active substructure incorporates the at least one area adapted to absorb high energy or energetic photons and the at least one semiconductor base metamaterial region, near the rear face of said slab, wafer or chip.

18. Method according to claim 14, further comprising the step of: forming, on the front surface of said slab, wafer or chip, an antireflection and light transmitting multilayer nanostructure having a graded-index profile, designed to couple optically the photovoltaic material and a front face environment of the photovoltaic material.

* * * * *